(12) United States Patent
Hawes et al.

(10) Patent No.: US 11,437,808 B2
(45) Date of Patent: Sep. 6, 2022

(54) SYSTEM FOR CONTROLLING PHASE SHIFTING OF SUPERCONDUCTING ELECTRIC MACHINES

(71) Applicant: General Electric Company, Schenectady, NY (US)

(72) Inventors: Nathaniel Benedict Hawes, Milton, NY (US); Yuntao Xu, Clifton Park, NY (US); Nidhishri Tapadia, Arvada, CO (US); David Allan Torrey, Ballston Spa, NY (US); Anbo Wu, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 343 days.

(21) Appl. No.: 16/589,272

(22) Filed: Oct. 1, 2019

(65) Prior Publication Data
US 2021/0098983 A1    Apr. 1, 2021

(51) Int. Cl.
*H02H 7/00* (2006.01)
*H01P 1/18* (2006.01)
(Continued)

(52) U.S. Cl.
CPC .............. *H02H 7/001* (2013.01); *H01P 1/18* (2013.01); *H02K 55/04* (2013.01); *H03H 7/18* (2013.01)

(58) Field of Classification Search
CPC .......... H02K 55/00–04; H02K 7/1838; H02K 7/1823; H02K 16/02; H02K 16/00;
(Continued)

(56) References Cited

U.S. PATENT DOCUMENTS

| 8,212,437 | B2 | 7/2012 | Evangelos et al. |
| 8,643,240 | B2 | 2/2014 | Umemoto et al. |

(Continued)

FOREIGN PATENT DOCUMENTS

| WO | 02063751 A1 | 8/2002 |
| WO | 2014068826 A1 | 5/2014 |

OTHER PUBLICATIONS

Liu, Dong et al., "Ripple Field AC Losses in 10-MW Wind Turbine Generators With a MgB2 Superconducting Field Winding," IEEE Transactions on Applied Superconductivity, IEEE Service Center, Los Alamitos, CA, US, vol. 26, No. 3 , Apr. 1, 2016 (Apr. 1, 2016), pp. 1-5.

(Continued)

*Primary Examiner* — Bryan R Perez
(74) *Attorney, Agent, or Firm* — Dority & Manning, P.A.

(57) ABSTRACT

A wind turbine includes a superconducting generator having an armature and a superconducting field winding set. The armature includes at least one multiphase armature winding set having a plurality of armature windings. The superconducting field winding set is separated by a gap from the armature. The superconducting field winding set includes a plurality of field windings, wherein one of the armature winding set and superconducting field winding set is connectable to rotate with a rotating component of the wind turbine and another of the armature and the superconducting field winding set being non-rotating. The wind turbine also includes a controllable power converter coupled to the at least one multiphase armature winding set and a controller configured to control switching operations of the controllable power converter to effect a phase shift among the plurality of armature windings.

18 Claims, 7 Drawing Sheets

(51) Int. Cl.
*H02K 55/04* (2006.01)
*H03H 7/18* (2006.01)

(58) Field of Classification Search
CPC .. H02K 3/47; H02H 7/001; H02P 1/16; H02P 1/18; H02P 1/24; H02P 1/26; H02P 1/54; H02P 9/10; H02P 9/107; H02P 9/08; H02P 9/04
See application file for complete search history.

(56) References Cited

U.S. PATENT DOCUMENTS

| | | |
|---|---|---|
| 9,252,645 B2 | 2/2016 | Crane |
| 9,541,064 B2 | 1/2017 | Rasmussen |
| 2014/0175796 A1* | 6/2014 | Rasmussen ............. H02J 3/381 290/44 |
| 2016/0276896 A1* | 9/2016 | Morrison ................. F03D 9/25 |
| 2017/0005565 A1* | 1/2017 | Bai ......................... H02M 1/15 |

OTHER PUBLICATIONS

Zhang, Zhongming et al., "Reduction of Rotor Harmonic Eddy-Current Loss of High-Speed PM BLDC Motors by Using a Split-Phase Winding Method," IEEE Transactions on Energy Conversion, IEEE Service Center, Piscataway, NJ, US, vol. 34, No. 3, Sep. 1, 2019 (Sep. 1, 2019), pp. 1593-1602.

European Search Report for EP Application No. 20199631.1, dated Feb. 4, 2021.

Wang et al., Study of Multiphase Superconducting Wind Generators With Fractional-Slot Concentrated Windings, IEEE Transactions on Applied Superconductivity, vol. 24, Issue 3, Jun. 2014, pp. 1-6.

Kulkarni et al., Design Improvisation for Reduced Harmonic Distortion in a Flux Pump-Integrated HTS Generator, Energies, vol. 10, Issue 9, Sep. 6, 2017, pp. 1-14.

\* cited by examiner

SYSTEM FOR CONTROLLING PHASE SHIFTING OF SUPERCONDUCTING ELECTRIC MACHINES

FIELD

The present disclosure relates generally to superconducting electric machines, such as superconducting wind turbine generators, and more particularly to superconducting electric machines having a controllable phase shifting capability.

BACKGROUND

Generally, superconducting generators include at least one superconducting coil which generates a static or rotating magnetic field and at least one armature coil which also generates a static or rotating magnetic field that interacts with the field from the superconducting coil. Further, superconducting generators are made by constructing the generator field coils (which typically carry a substantially direct current) of a superconducting material ("superconductor") instead of the usual copper material. Superconductors are typically lighter in weight and smaller in size (relative to current carrying capacity) than traditional conductors such as copper, and are also more efficient at conducting current (particularly at lower frequencies). Thus, the use of superconductors in power applications, such as wind turbine generators, provides benefits such as more efficient performance, lower generator weight, non-gearbox direct drive operation, and lower manufacturing and installation costs. Such benefits are particularly useful for offshore wind turbine applications.

The magnetic fields generated by the armature coil extend into zones within the generator which are held at low temperature. Due to the relative speed difference between the armature coil and the field, the fundamental armature field appears at 0 Hz within the low temperature zones. However, spatial and time harmonics from the armature field appear at frequencies greater than 0 Hz. These spatial and time harmonics can induce eddy currents within the superconducting coil and surrounding hardware. These eddy currents generate heat which must be rejected to ambient air via various cryocoolers which maintain the low temperature zones.

Due to the low temperature of the cold reservoir, Carnot's Theorem necessitates the Coefficient of Performance (COP) (i.e. the inverse of the amount of work which must be supplied to move 1 W of heat from the cold reservoir to ambient) to be small. This implies that even small losses within the low temperature regions may require large amounts of work to reject that heat to ambient. It is critically important, therefore, to minimize the generation of eddy currents in the cold regions of the generator.

Accordingly, the industry is in need of an improved superconducting electric machine capable of minimizing losses within the low temperature regions.

BRIEF DESCRIPTION

Aspects and advantages of the invention will be set forth in part in the following description, or may be obvious from the description, or may be learned through practice of the invention.

In one aspect, the present disclosure is directed to a wind turbine. The wind turbine includes a superconducting generator having an armature and a superconducting field winding set. The armature includes at least one multiphase armature winding set having a plurality of armature windings. The superconducting field winding set is separated by a gap from the armature. The superconducting field winding set includes a plurality of field windings, wherein one of the armature winding set and superconducting field winding set is connectable to rotate with a rotating component of the wind turbine and another of the armature and the superconducting field winding set being non-rotating. The wind turbine also includes a controllable power converter coupled to the at least one multiphase armature winding set and a controller configured to control switching operations of the controllable power converter to effect a phase shift among the plurality of armature windings.

In an embodiment, the armature includes a plurality of multiphase armature winding sets. Further, in an embodiment, the wind turbine includes controlling the phase shift among the plurality of armature windings as a function of time.

In another embodiment, the controller is configured to control switching operations of the controllable power converter to effect the phase shift at a fundamental frequency and/or a switching frequency of the controllable power converter.

In further embodiments, the controller is configured to phase shift fundamental frequencies of each of the plurality of armature windings relative to another of the plurality of armature windings. In still another embodiment, the controller is configured to phase shift carrier signals between each of the plurality of armature windings relative to another via a phase shift angle.

In additional embodiments, the controller is configured to control switching operations of the controllable power converter to effect the phase shift among the plurality of armature windings by modifying one or more phase shift angles thereof as a function of one or more inputs. In such embodiments, the input(s) may include a generator-commanded power, an actual power, current, a temperature of the low-temperature region, a power supplied to a cryocooler, a measurement of heat being rejected by the cryocooler, and/or combinations thereof.

In several embodiments, the superconducting field winding set may be located in a low-temperature region of the superconducting generator during operation of the wind turbine. In such embodiments, the multiphase armature winding set(s) may be located outside of the low-temperature region of the superconducting generator.

In still another embodiment, the wind turbine may include a cryocooler for transporting heat from the low-temperature region to ambient via a thermodynamic cycle. In such embodiments, the controller is configured to minimize the heat which the cryocooler must reject by control switching operations of the controllable power converter to effect the phase shift among the plurality of armature windings.

In particular embodiments, the superconducting field winding set may also be surrounded by a thermal shield maintained at a predetermined temperature range during operation of the wind turbine. For example, in such embodiments, the predetermined temperature range may range from about 25 Kelvin to about 50 Kelvin.

In another aspect, the present disclosure is directed to a superconducting electric machine system. The electric machine system includes a superconducting electric machine having an armature and a superconducting field winding set. The armature includes at least one multiphase armature winding set having a plurality of armature windings. The superconducting field winding set is separated by a gap from the armature. The superconducting field winding set includes a plurality of field windings, wherein one of the armature winding set and superconducting field winding set is connectable to rotate with a rotating component of the wind turbine and another of the armature and the superconducting field winding set being non-rotating. The wind turbine also includes a controllable power converter coupled to the at least one multiphase armature winding set and a controller configured to control switching operations of the controllable power converter to effect a phase shift among the plurality of armature windings. It should be further understood that the superconducting electric machine system may further include any of the additional features described herein.

In another aspect, the present disclosure is directed to a method of operating an electric machine system. The superconducting electric machine system has a superconducting electric machine having an armature and a superconducting field winding set. The armature has at least one multiphase armature winding set having a plurality of armature windings. The superconducting field winding set is separated by a gap from the armature. The superconducting field winding set has a plurality of field windings, wherein one of the armature winding set and superconducting field winding set is connectable to rotate with a rotating component of the wind turbine and another of the armature and the superconducting field winding set being non-rotating. The method includes providing the superconducting field winding set in a low-temperature region of the electric machine during operation of the electric machine system. Further, the method includes controlling switching operations of a controllable power converter to effect a phase shift among the plurality of armature windings so as to minimize losses within the low-temperature region. It should be further understood that the method may further include any of the additional features and/or steps described herein.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

The present disclosure encompasses any manner of superconducting electric machines, and is not limited to superconducting generators. For sake of explanation, the present system is described herein with reference to a superconducting generator in general, and more particularly to a wind turbine superconducting generator.

Figure 1:
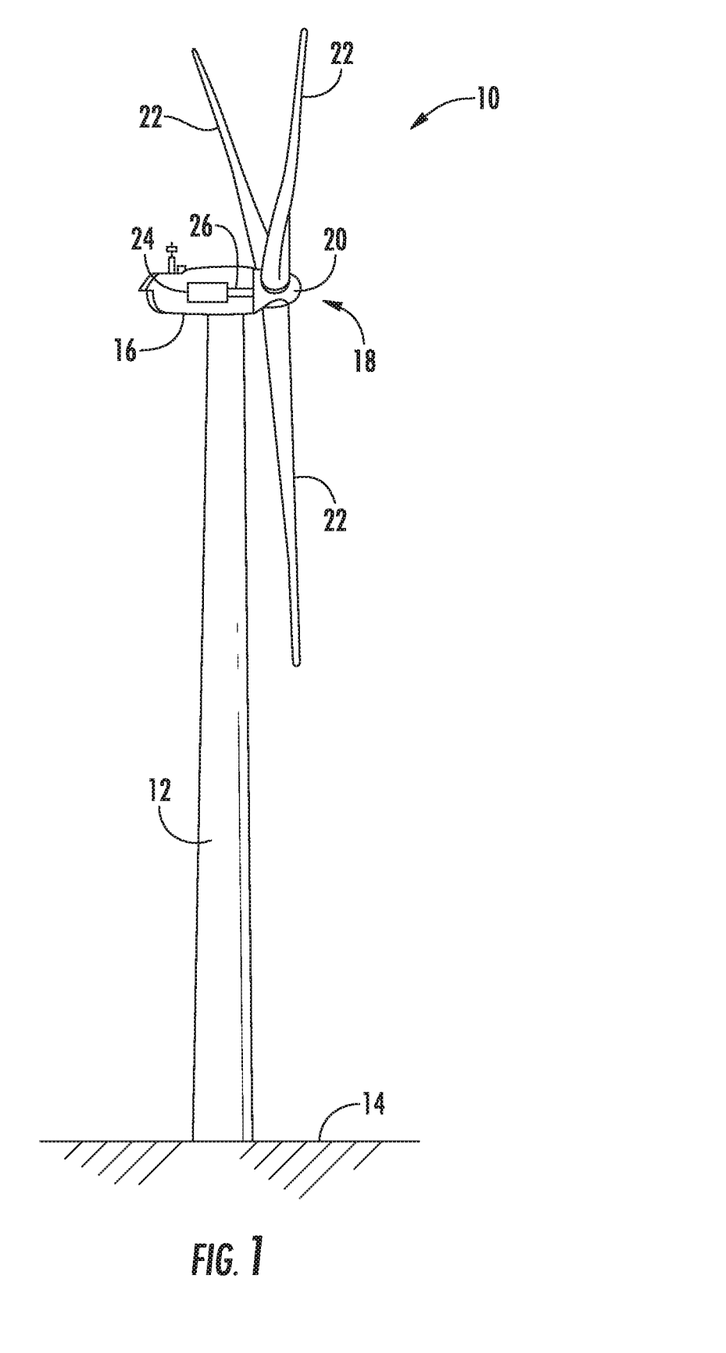
FIG. 1 illustrates a perspective view of an embodiment of a wind turbine with a superconducting generator according to the present disclosure.

Referring now to the drawings, FIG. 1 illustrates a perspective view of one embodiment of a wind turbine power generating system 10. As shown, the wind turbine 10 generally includes a tower 12 extending from a support surface 14, a nacelle 16 mounted on the tower 12, and a rotor 18 coupled to the nacelle 16. The rotor 18 includes a rotatable hub 20 and at least one rotor blade 22 (three are shown) coupled to and extending outwardly from the hub 20. Each rotor blade 22 may be spaced about the hub 20 to facilitate rotating the rotor 18 to enable kinetic energy to be transferred from the wind into usable mechanical energy, and subsequently, electrical energy. For this purpose, the rotor 18 is coupled to a generator 24 via a shaft 26. For purposes of the present disclosure, the generator 24 is a direct drive superconducting generator.

The present invention encompasses a wind turbine power generating system 10, as described above, wherein the generator 24 is configured as a three-phase superconducting generator as set forth below. The present invention also encompasses various methodologies of operating a superconducting generator, in particular a wind turbine superconducting generator in accordance with method aspects set forth below.

Figure 2:
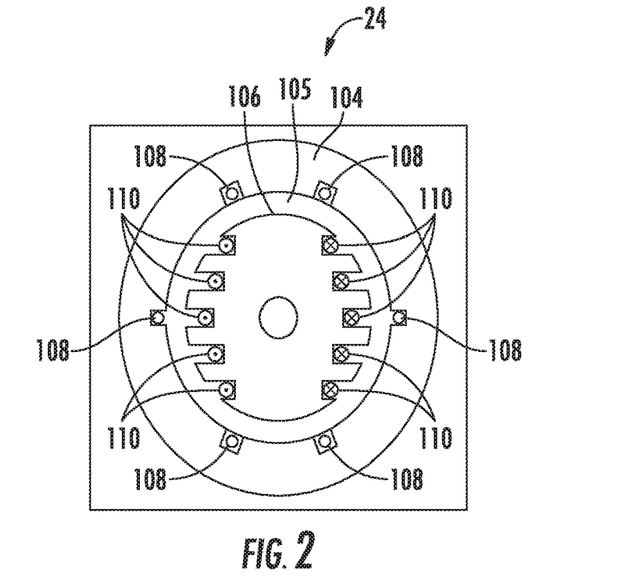
FIG. 2 illustrates a cross-sectional view of one embodiment of a superconducting generator according to the present disclosure.

Referring now to FIG. 2, a cross-sectional view of one embodiment of the superconducting generator 24 from FIG. 1 is illustrated. Although the superconducting generator 24 is illustrated and described herein, it should be understood that the features described herein may apply to any superconducting electric machine and is not limited to wind turbine power systems.

As depicted, the generator 24 includes an outer concentric component 104, which may be the stator, and an inner concentric component 106, which may be the rotor (e.g., in an internal rotor configuration). However, in other embodiments, the outer component 104 may be a rotor of the generator 24, and the inner component 106 may be a stator of the generator 24 (e.g., in an external rotor configuration). Further, as shown, a gap (or "air gap") 105 may be defined between the outer component 104 and the inner component 106 so as to allow movement (e.g., rotation) therebetween. The field winding set(s) is attached, for example, to the inner component 106 and the armature is attached, for example, to the outer component 104. The field winding set(s) may be disposed within the armature or outside of the armature. For purposes of explanation not limitation, the field winding set(s) is attached to the inner component 106 and is stationary and the armature is attached to the outer component 104. Also for purposes of explanation not limitation, the field winding set(s) is stationary and the armature rotates.

In addition, as shown, the armature includes at least one multiphase armature winding set having a plurality of armature windings 108 attached to the outer component 104 or the inner component. The field winding set(s) includes a plurality of field windings 110 attached to the other of the outer or inner components 104, 106. In addition, the superconducting field winding set is separated by a gap from the armature.

The field windings have superconducting properties at sufficiently low temperature, magnetic field, and current density. Accordingly, the field windings are operated within one or more low temperature zones. During operation of the generator 24, these windings 108, 110 are in electromagnetic communication.

The field windings carry excitation, wherein current flowing therethrough produces a magnetic field through the field winding, and the armature windings can be connected to a controllable power converter coupled to the multiphase armature winding set. Although several windings 108, 110 are depicted, there may be more or less windings 108, 110 and/or windings thereof about the outer component 106 and inner component 108 in various embodiments, e.g., to configure the number of poles of the generator 24 and, thereby, the generating frequency and/or other operating characteristics of the generator 24.

The magnetic field generated by the armature windings 108 is due to the magneto-motive force (MMF) setup by the current which flows through the armature windings 108. The MMF has both spatial and temporal harmonics associated with it due to the discretization of the windings, magnetic saturation within the steel structures, and the pulse-width modulation scheme employed by a switching electric power converter to drive the current waveform to a desired shape. While the fundamental MMF component appears at 0 Hz for components located within the low temperature zones, MMF harmonics appear at frequencies greater than 0 Hz. These harmonics generate eddy currents within the components within the low temperature zones and hence, will generate heat which must be rejected by the cryocoolers.

The field windings 110, may be constructed of a superconducting material, such as niobium-titanium (NbTi), niobium-tin (Nb3Sn), or magnesium-diboride (MgB2). Typically, the armature windings 108 are constructed from copper and are normally conducting. However, in certain embodiments, the armature windings 108 may also be constructed of a superconducting material, such as NbTi, Nb3Sn, or MgB2. In certain embodiments, the superconducting material may also be a high temperature superconductor, such as YBCO or ReBCO.

Thus, in principle, there are two distinct frequency groups which are of interest in superconducting electric machines: (1) low-frequency harmonics at 5x, 7x, 11x, . . . the fundamental frequency and, (2) high-frequency harmonics centered around 1x, 2x, 3x, . . . switching frequency. The low-frequency harmonics are dominated by the spatial harmonics of the armature windings 108 while the high-frequency harmonics are dominated by the switching functions employed by the electric power converter which regulates the armature current.

Accordingly, in an embodiment, the present disclosure is directed to reducing the low-frequency harmonics by utilizing a generator with a phase order larger than three. For example, in one embodiment, the present disclosure is directed to a generator having multiple three-phase winding sets within the armature. The fundamental currents in these separate three-phase sets can be phase-shifted relative to each other to reduce the spatial harmonics of the armature MMF within the machine.

Figure 3:
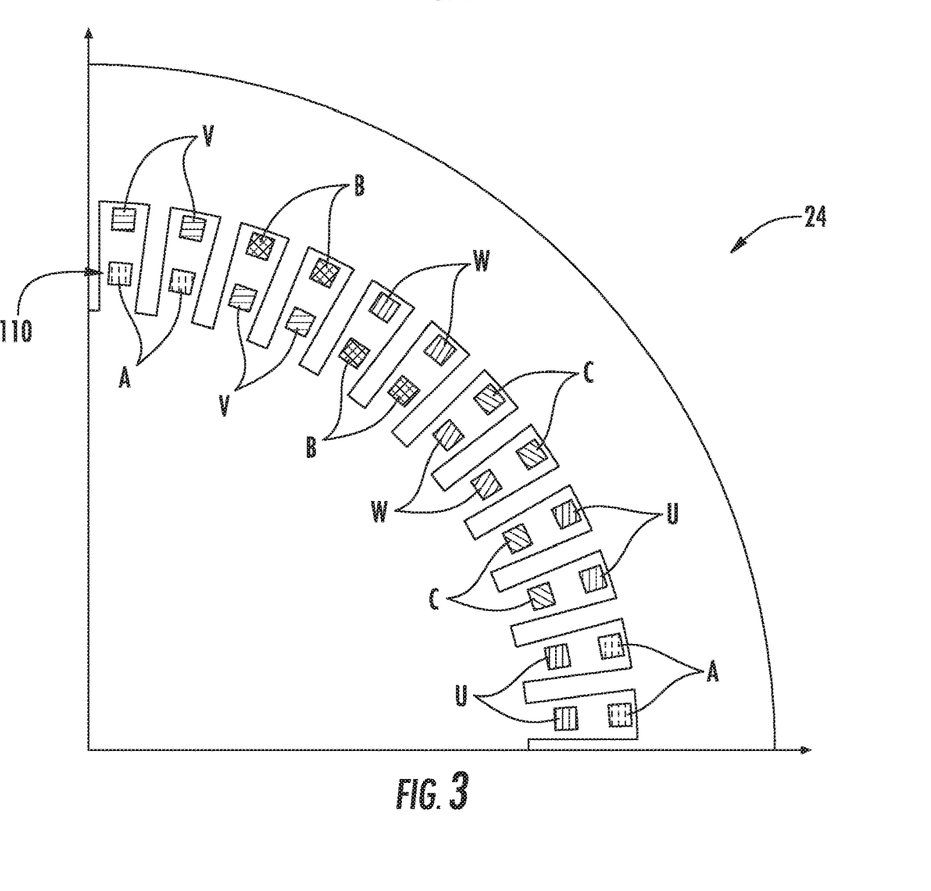
FIG. 3 illustrates a partial, cross-sectional view of another embodiment of a superconducting generator according to the present disclosure.
Figure 4:
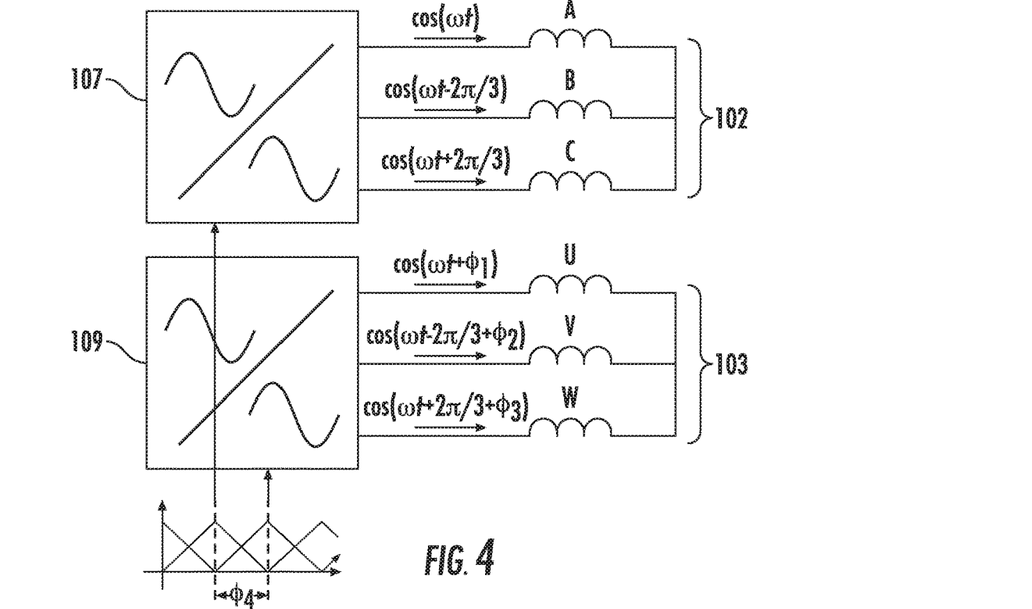
FIG. 4 illustrates a schematic view of one embodiment of a superconducting generator having two three-phase winding sets excited by electric power converters according to the present disclosure.

More particularly, as shown in FIGS. 3 and 4, various views of one embodiment of the superconducting generator 24 having multiple three-phase winding sets according to the present disclosure are illustrated. FIG. 3 illustrates a partial, cross-sectional view of one embodiment of the superconducting generator 24 having two three-phase winding sets according to the present disclosure, with two slots per pole per phase with the ABCUVW coil-sides labeled. Three phase winding set 102 is comprised of the A, B, and C coil sides while three phase winding set 103 is comprised of the U, V, and W coil sides. FIG. 4 illustrates a schematic view of the embodiment of FIG. 3, which includes two three-phase winding sets 102, 103 of the superconducting generator 24 interfaced to electric power converters 107, 109 according to the present disclosure. In such embodiments, wherein the generator 24 includes two three-phase winding sets 102, 103, the neutral point may be buried.

More specifically, FIG. 3 illustrates one embodiment of a winding pattern for the generator 24 with two three-phase winding sets 102, 103, where the first winding set 102 includes three single-phase armature windings 108 (e.g. A, B, and C) and the second winding set 103 includes different three single-phase armature windings 108 (e.g. U, V, and W). Further, as shown in FIG. 3, each of single-phase armature windings 108 are spatially displaced such that there is a phase difference (e.g. of 120° electrical) among voltages induced in each of the armature windings 108. Moreover, each of the three single-phase armature windings 108 is excited at a fundamental frequency. The fundamental currents within phases UVW are identical to the currents within phases ABC except for temporal phase shift variables $\phi_1$, $\phi_2$, and $\phi_3$.

Figure 7:
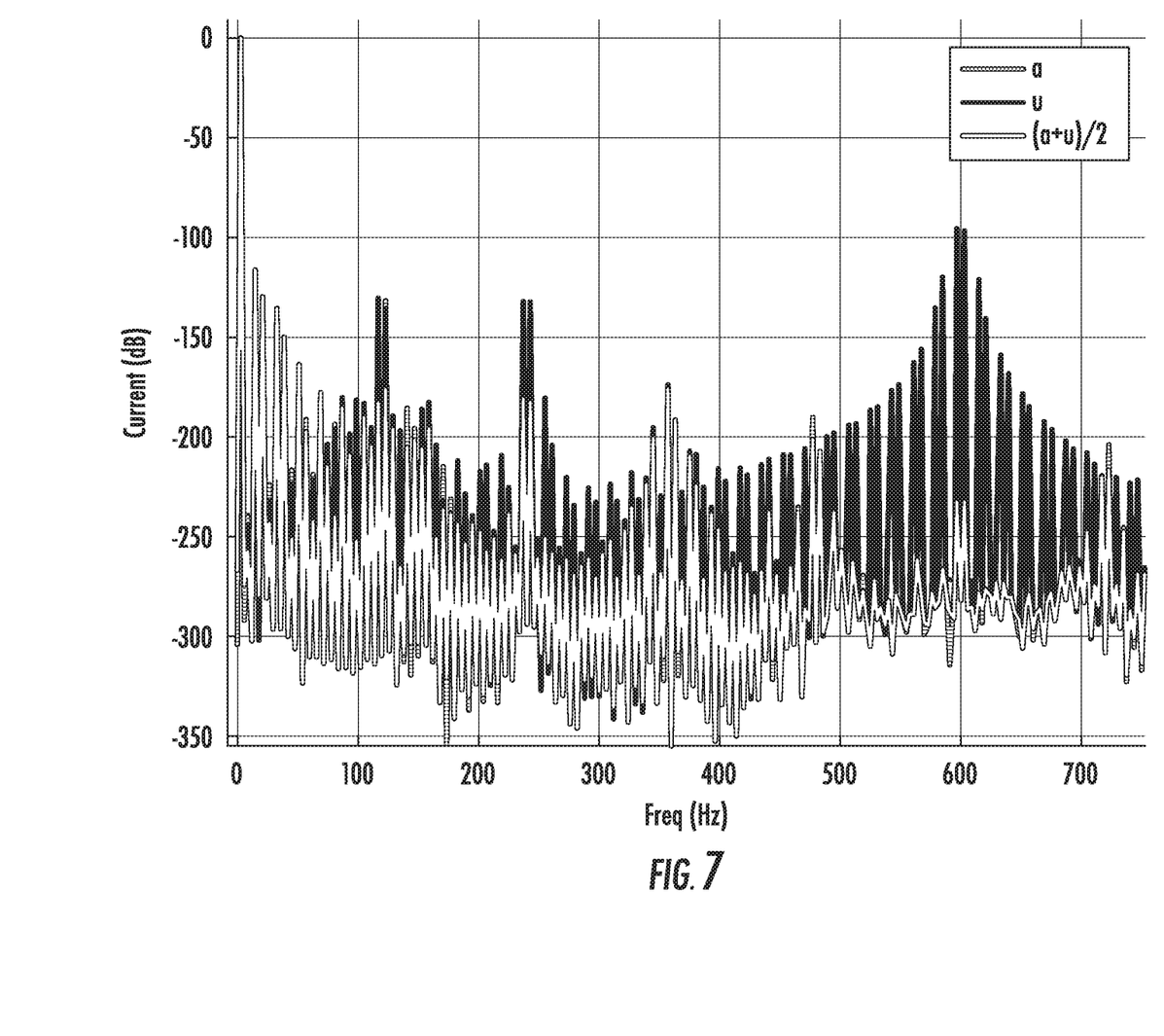
FIG. 7 illustrates a graph of the Fast Fourier Transform (FFT) of a phase A current waveform and a phase U current waveform and the average of phases A and U with $\phi_1=0$ according to the present disclosure.
Figure 8:
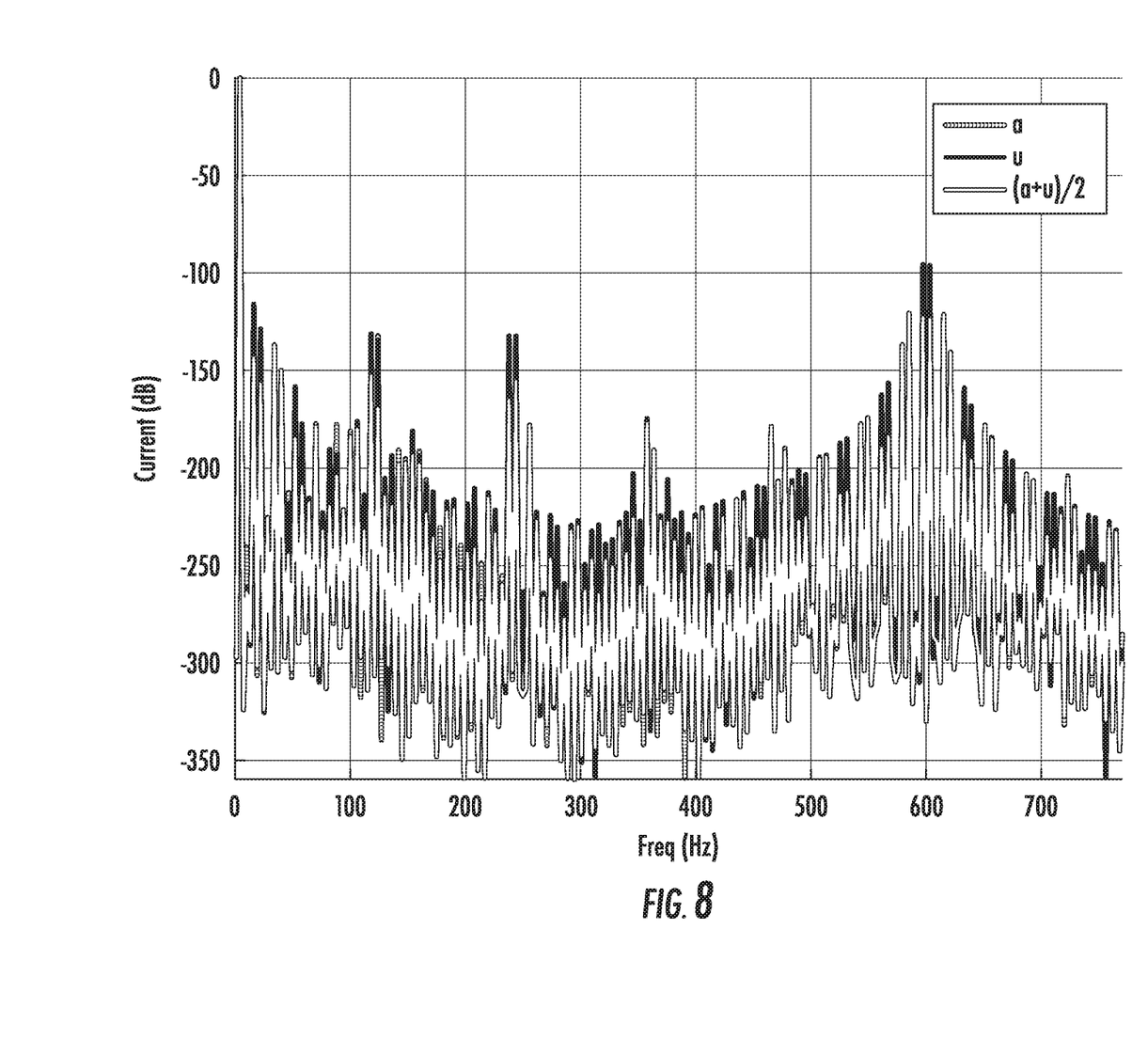
FIG. 8 illustrates a graph of the FFT of a phase A current waveform and a phase U current waveform and the average of phases A and U with $\phi_1=\pi/6$ according to the present disclosure.

Reduction of the high frequency harmonics is accomplished by modifying the temporal phase shift between PWM carriers between the different phase groups. Referring particularly to FIG. 4, $\phi_4$ represents the phase shift between the carrier waveforms for the two three-phase winding sets. FIGS. 7 and 8 provide the Fast Fourier Transform (FFT) for currents in phase A, phase U, and the average of phase A and phase U for $\phi_4=\pi$. In FIG. 7, $\phi_1=0$ while in FIG. 8, $\phi_1=\pi/6$.

As shown particularly in FIG. 7, the fundamental phase shift between phases A and U is zero, however, the carrier frequencies between the phases are 180 degrees (π radians) shifted. The ordinate is the magnitude of current harmonics in dB referenced to rated generator current and the abscissa represents the frequency of the harmonics in Hz. The fundamental current magnitude at 3 Hz is equal to 0 dB. The low order harmonics at 15 Hz, 21 Hz, 33 Hz, . . . are not suppressed by the averaging. The odd switching harmonics (centered upon 600 Hz, 1800 Hz, 3000 Hz, . . . ) are well suppressed by this method, however, even switching harmonics (centered upon 1200 Hz, 2400 Hz, 3600 Hz, . . . ) are not.

As shown particularly in FIG. 8, the fundamental phase shift between phases A and U is 30 degrees and the phase shift between the carrier frequencies is 180 degrees ($\pi$ radians). The ordinate is the magnitude of current harmonics in dB referenced to rated generator current and the abscissa represents the frequency of the harmonics in Hz. The fundamental current magnitude at 3 Hz is equal to 0 dB. The low order harmonics at 15 Hz, 21 Hz, 33 Hz, . . . are suppressed by the averaging. All switching harmonics are slightly reduced in magnitude, but they are not cancelled to nearly the same degree as they were in FIG. 7.

As shown in FIG. 7, the low frequency time harmonics are not impacted by the phase shifting, however, switching harmonics near 600 Hz are perfectly cancelled. In contrast, as shown in FIG. 8, the low frequency time harmonics are reduced by the phase shifting; however, switching harmonics are only slightly reduced. This implies that mitigation of the high frequency temporal harmonics is compromised by mitigation of the spatial harmonic content via fundamental phase shifting.

In circumstances where the fundamental current loading is low, the losses incident upon the low-temperature region 112 (FIG. 6) will be dominated by the high frequency switching content. In these situations, it may be advantageous to set the phase shifts $\phi_1=\phi_2=\phi_3=0$, while leaving the carrier phase shift $\phi_4=\pi$. When the fundamental current loading is high, the losses from the spatial harmonics may be on the same order of magnitude as that of the high frequency temporal harmonics. Hence, the optimal phase shift parameters $\phi_1$, $\phi_2$, $\phi_3$, $\phi_4$ must be found.

Figure 6:
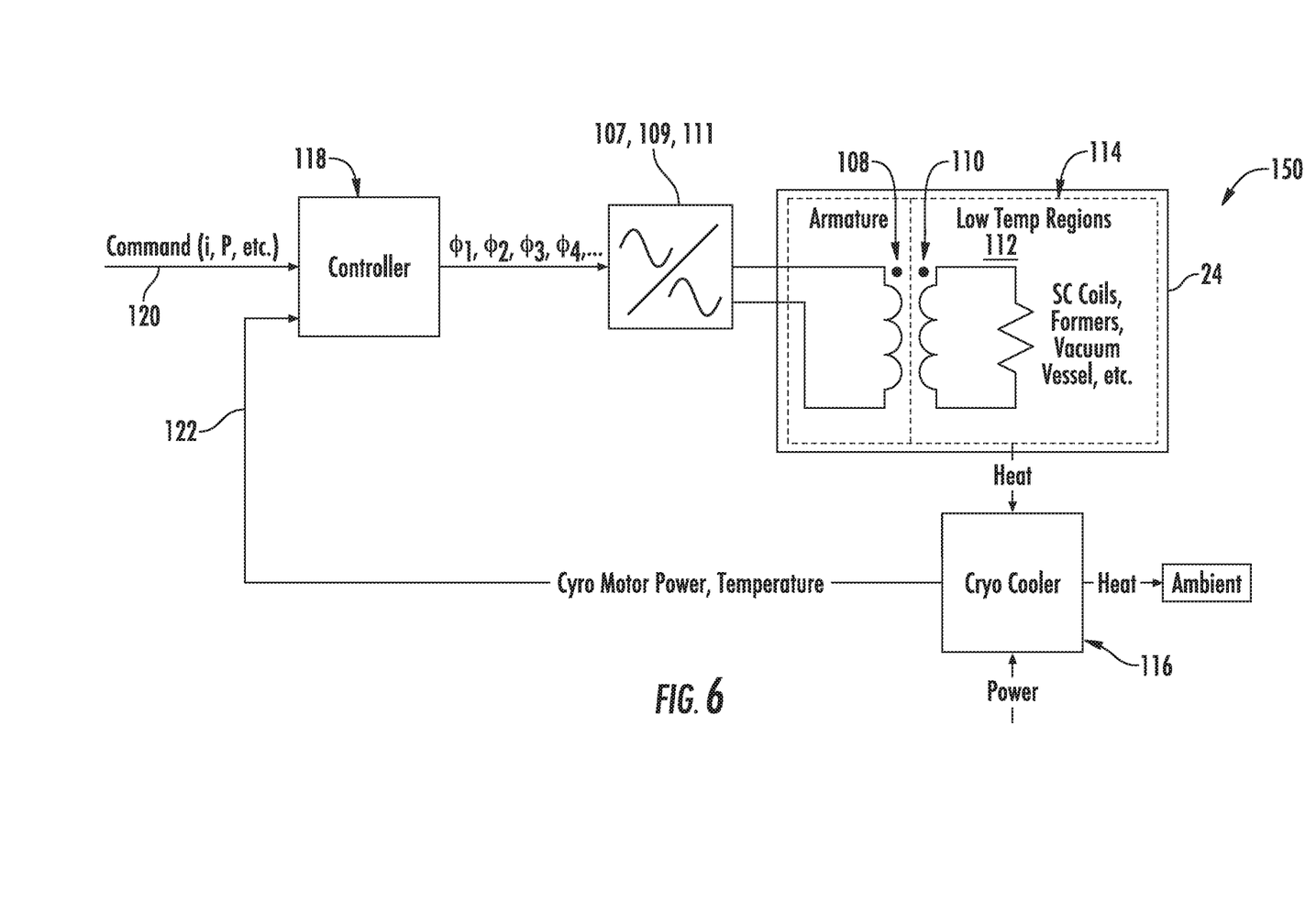
FIG. 6 illustrates a schematic view of one embodiment of a control system for a superconducting generator according to the present disclosure.

Referring now to FIG. 6, an exemplary embodiment of a control system 150 used to implement the loss minimization according to the present disclosure is illustrated. As shown, the magnetic fields generated from the armature windings 108 extend into zones within the generator 24 which are held at low temperature (referred to as low-temperature region 112). More specifically, as shown, the armature windings 108 may be magnetically coupled to components located within low temperature region 112 such as the field windings 110, coil formers, vacuum vessels, etc.

For example, in one embodiment, the low-temperature region 112 of the superconducting generator 24 may range from about 0 Kelvin (K) to about 5 K, such as about 4 K, although it should be understood that the region 112 may include temperatures greater than 5 K as well. More specifically, as shown, the field windings 110 may be coupled to the armature windings 108 that are outside of the low-temperature region 112 of the generator 24. In addition, as shown, the field windings 110 may be surrounded by a thermal shield 114 maintained at a predetermined temperature range. For example, in an embodiment, the predetermined temperature range may range from about 25 K to about 50 K. In further embodiments, the area outside of the field cryostat may be maintained at an operating temperature higher than ambient temperature, such as about 325 K.

Due to the relative speed difference between the armature and the field, the fundamental armature field appears at 0 Hz within the low temperature zone 112. However, spatial and time harmonics from the armature field appear at frequencies greater than 0 Hz. These spatial and time harmonics can then induce eddy currents within the superconducting coil and surrounding hardware. These eddy currents generate heat which must be rejected to ambient via one or more cryocoolers 116 which maintain the low temperature zone 112. More specifically, the cryocooler(s) 116 is configured to transport heat from the low-temperature region 112 to ambient via a thermodynamic cycle (Gifford-McMahon, Stirling, Magneto-caloric, etc.).

Due to the low temperature of the cold reservoir, Carnot's Theorem necessitates that the Coefficient of Performance (COP) (i.e. the inverse of amount of work which must be supplied to move 1 W of heat from cold reservoir to ambient) must be small. This implies that even small losses within the low temperature region 112 may require large amounts of work to reject heat to ambient. Therefore, it is important to minimize the generation of eddy currents in the low temperature region 112 of the generator 24 in a practical generator design.

Thus, still referring to FIG. 6, the control system 150 may also include a controller 118 communicatively coupled to the controllable power converter(s) 107, 109 so as to control switching operations of the controllable power converter(s) 107, 109 to effect a phase shift among the plurality of armature windings 108. For example in one embodiment, the controller 118 may be configured to control the phase shift among the plurality of armature windings 108 as a function of time. In addition, in an embodiment, the controller 118 may be configured to modify one or more phase shift angles of the fundamental frequency of the single-phase armature windings 108 and/or the switching frequency of the generator 24. More specifically, in certain embodiments, the controller 118 described herein may select $\phi_1=\phi_2=\phi_3=\pi/6$, thereby resulting in the machine collapsing to a six-phase machine which would minimize the spatially induced losses.

In such embodiments, the controller 118 may be configured to phase shift the fundamental frequencies of each of the plurality of armature windings 108 relative to another of the plurality of armature windings 108. In addition, in an embodiment, the controller 118 may be configured to phase shift carrier signals between each of the plurality of armature windings 108 relative to another via a phase shift angle.

Thus, as shown, the controller 118 may be configured to optionally receive a first set of inputs 120 which represent the generator commanded or actual power and/or current. The controller 118 may also be configured to optionally receive a second set of inputs 122 which represent the temperature of the low temperature region 112, the power supplied to the cryocooler 116, the current supplied to the cryocooler 116, and/or a direct measurement of the heat being rejected. Thus, the controller 118 may take some combination of the first and second inputs 120, 122 with the goal of minimizing the heat which the cryocooler 116 must transport out of the field winding by modifying the phase shift angles $\phi_1$-$\phi_4$ shown in FIG. 4.

The controller 118 can be configured to continuously modify the phase shift angles. Some examples of methods the controller 118 may employ are; classic feedback control structures (lag-lead, PID, etc.), feed-forward calculations, perturb and observe non-linear optimizers, non-linear adaptive regulators, genetic algorithms, and artificial intelligence, among others.

Accordingly, the superconducting generator 24 and method of operating same of the present disclosure minimizes the losses within the low temperature region 112. By phase shifting the fundamental and switching harmonics of the generator 24, the losses within the low temperature region 112 of the superconducting generator 24 may be reduced through cancellation of non-synchronous field components. This provides a reduction in the number of cryocoolers needed to support the superconducting state of the field windings. A reduction in the number of cryocoolers increases system efficiency, reliability, and reduces cost.

Figure 5:
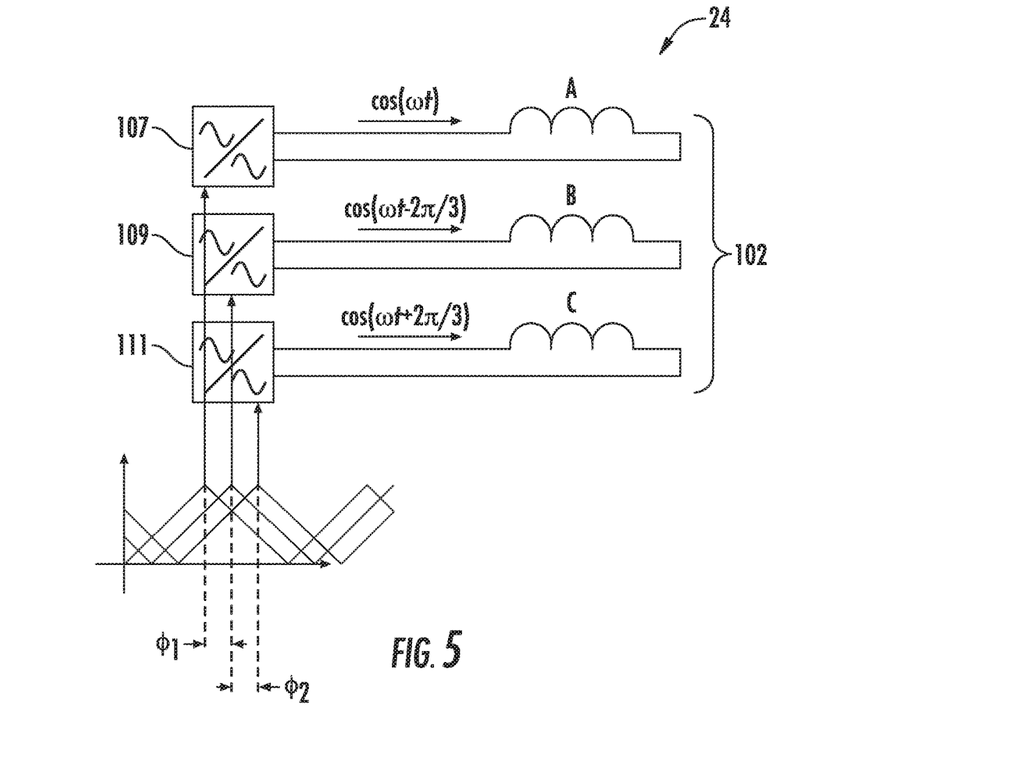
FIG. 5 illustrates a schematic view of another embodiment of a superconducting generator having a single three-phase winding set excited by electric power converters according to the present disclosure.

In alternative embodiments, as shown in FIG. 5, the generator 24 (not shown) may include a single three-phase armature winding set 102, e.g. with a neutral point that is not buried. Each armature winding 102 is excited by an electric power converter 107, 109, 111. In such embodiments, the controller 118 may be configured to independently excite each of the single-phase armature windings 102 (e.g. A, B, and C) of the single three-phase winding set 102. In addition, in an embodiment, the controller 118 may be configured to phase shift carrier signals between each of the single-phase armature windings 102 relative to the other via a phase shift angle. As a result, the carriers between the three phases can be directly phase shifted by phase shift variables $\phi_1$ and $\phi_2$.

Figure 9:
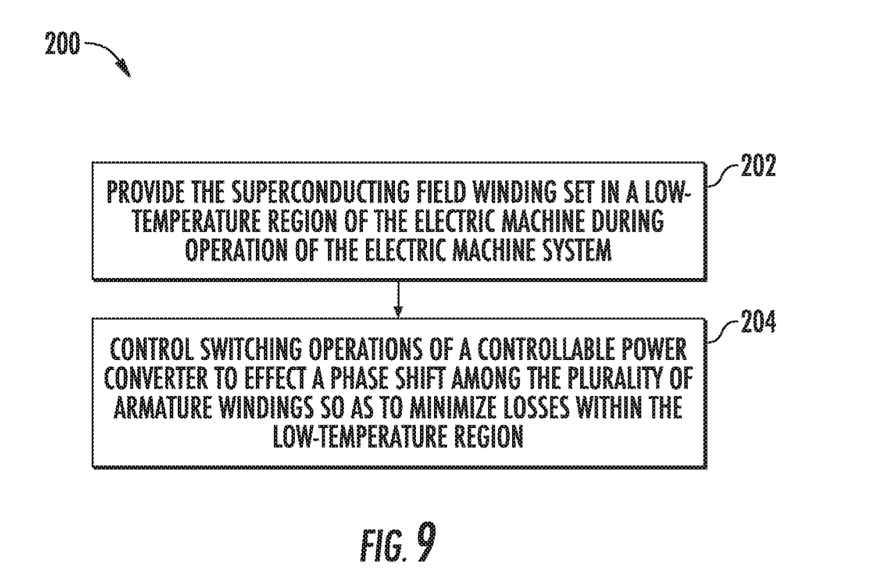
FIG. 9 illustrates a flow diagram of one embodiment of a method for operating a superconducting generator according to the present disclosure.

Referring now to FIG. 9, a flow diagram of one embodiment of a method 200 of operating a superconducting electric machine according to the present disclosure is illustrated. In general, the method 200 described herein generally applies to operating the wind turbine 10 described above. However, it should be appreciated that the disclosed method 200 may be implemented using any other suitable wind turbine and/or superconducting electric machine. Further, FIG. 9 depicts steps performed in a particular order for purposes of illustration and discussion. Those of ordinary skill in the art, using the disclosures provided herein, will understand that various steps of any of the methods disclosed herein can be adapted, omitted, rearranged, or expanded in various ways without deviating from the scope of the present disclosure.

As shown at (202), the method 200 includes providing the superconducting field winding set in a low-temperature region of the electric machine during operation of the electric machine system. As shown at (204), the method 200 includes controlling switching operations of a controllable power converter to effect a phase shift among the plurality of armature windings so as to minimize losses within the low-temperature region.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A wind turbine, comprising:
a superconducting generator comprising an armature and a superconducting field winding set located in a low-temperature region of the superconducting generator during operation of the wind turbine, the armature comprising at least one multiphase armature winding set located outside of the low-temperature region of the superconducting generator, the at least one multiphase armature winding set comprising a plurality of armature windings, the superconducting field winding set separated by a gap from the armature, the superconducting field winding set comprising a plurality of field windings, wherein one of the armature winding set and the superconducting field winding set is connectable to rotate with a rotating component of the wind turbine and another of the armature winding set and the superconducting field winding set being non-rotating;
a controllable power converter coupled to the at least one multiphase armature winding set; and
a controller configured to control switching operations of the controllable power converter to implement independent phase shifting of fundamental and switching harmonics among the plurality of armature windings of the superconducting generator to minimize losses within the low-temperature region.

2. The wind turbine of claim 1, wherein the armature comprises a plurality of multiphase armature winding sets.

3. The wind turbine of claim 1, further comprising implementing the phase shifting of the fundamental and switching harmonics among the plurality of armature windings of the superconducting generator as a function of time.

4. The wind turbine of claim 1, wherein the controller is configured to phase shift fundamental frequencies of each of the plurality of armature windings relative to another of the plurality of armature windings.

5. The wind turbine of claim 1, wherein the controller is configured to phase shift carrier signals between each of the plurality of armature windings relative to another via a phase shift angle.

6. The wind turbine of claim 1, wherein the controller is configured to control the switching operations of the controllable power converter by modifying one or more phase shift angles thereof as a function of one or more inputs, the one or more inputs comprising at least one of a generator-commanded power, an actual power, current, a temperature of the low-temperature region, a power supplied to a cryocooler, a current supplied to the cryocooler, a measurement of heat being rejected by the cryocooler, and/or combinations thereof.

7. The wind turbine of claim 1, further comprising a cryocooler for transporting heat from the low-temperature region to ambient via a thermodynamic cycle, the controller configured to minimize the heat which the cryocooler must reject by controlling the switching operations of the controllable power converter.

8. The wind turbine of claim 1, wherein the superconducting field winding set is surrounded by a thermal shield maintained at a predetermined temperature range during operation of the wind turbine, the predetermined temperature range ranging from 25 Kelvin to 50 Kelvin.

9. A superconducting electric machine system, comprising:
a superconducting electric machine comprising an armature and a superconducting field winding set located in a low-temperature region of the superconducting electric machine, the armature comprising at least one multiphase armature winding set located outside of the low-temperature region of the superconducting electric machine, the at least one multiphase armature winding set comprising a plurality of armature windings, the superconducting field winding set separated by a gap from the armature, the superconducting field winding set comprising a plurality of field windings, wherein one of the armature winding set and superconducting field winding set is connectable to rotate with a rotating component of the electric machine system and another of the armature and the superconducting field winding set being non-rotating;

a controllable power converter coupled to the at least one multiphase armature winding set; and a controller configured to control switching operations of the controllable power converter to implement independent phase shifting of fundamental and switching harmonics among the plurality of armature windings of the superconducting generator to minimize losses within the low-temperature region.

10. The superconducting electric machine system of claim 9, further comprising implementing the phase shifting of the fundamental and switching harmonics among the plurality of armature windings of the superconducting generator as a function of time.

11. The superconducting electric machine system of claim 9, wherein the controller is configured to phase shift fundamental frequencies of each of the plurality of armature windings relative to another of the plurality of armature windings and phase shift carrier signals between each of the plurality of armature windings relative to another via a phase shift angle.

12. The superconducting electric machine system of claim 9, wherein the controller is configured to control the switching operations of the controllable power converter by modifying one or more phase shift angles thereof as a function of one or more inputs, the one or more inputs comprising at least one of a generator-commanded power, an actual power, current, a temperature of the low-temperature region, a power supplied to a cryocooler, a current supplied to the cryocooler, a measurement of heat being rejected by the cryocooler, and/or combinations thereof.

13. A method of operating an electric machine system, the superconducting electric machine system having a superconducting electric machine having an armature and a superconducting field winding set located in a low-temperature region of the superconducting electric machine, the armature having at least one multiphase armature winding set located outside of the low-temperature region of the superconducting electric machine, the at least one multiphase armature winding set having a plurality of armature windings, the superconducting field winding set separated by a gap from the armature, the superconducting field winding set having a plurality of field windings, wherein one of the armature winding set and superconducting field winding set is connectable to rotate with a rotating component of the wind turbine and another of the armature and the superconducting field winding set being non-rotating, the method comprising:

controlling switching operations of a controllable power converter to implement independent phase shifting of fundamental and switching harmonics among the plurality of armature windings so as to minimize losses within the low-temperature region.

14. The method of claim 13, wherein the armature comprises a plurality of multiphase armature winding sets.

15. The method of claim 13, further comprising implementing the phase shifting of the fundamental and switching harmonics among the plurality of armature windings of the superconducting generator as a function of time.

16. The method of claim 13, further comprising phase shifting fundamental frequencies of each of the plurality of armature windings relative to another of the plurality of armature windings.

17. The method of claim 13, further comprising phase shifting carrier signals between each of the plurality of armature windings relative to another via a phase shift angle.

18. The method of claim 13, wherein controlling the switching operations of the controllable power converter further comprises:

modifying one or more phase shift angles thereof as a function of one or more inputs, the one or more inputs comprising at least one of a generator-commanded power, an actual power, current, a temperature of the low-temperature region, a power supplied to a cryocooler, a current supplied to the cryocooler, a measurement of heat being rejected by the cryocooler, and/or combinations thereof.

* * * * *